(12) United States Patent
Takahashi (10) Patent No.: US 10,065,418 B2
(45) Date of Patent: Sep. 4, 2018

(54) LIQUID EJECTION HEAD AND METHOD OF PRODUCING THE SAME

(71) Applicant: CANON KABUSHIKI KAISHA, Tokyo (JP)

(72) Inventor: Tomohiro Takahashi, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/216,410

(22) Filed: Jul. 21, 2016

(65) Prior Publication Data
US 2017/0021622 A1 Jan. 26, 2017

(30) Foreign Application Priority Data
Jul. 23, 2015 (JP) ................... 2015-145602

(51) Int. Cl.
*B41J 2/255* (2006.01)
*B41J 2/14* (2006.01)
*B41J 2/16* (2006.01)

(52) U.S. Cl.
CPC . *B41J 2/14* (2013.01); *B41J 2/16* (2013.01); *B41J 2/1623* (2013.01); *B41J 2002/14491* (2013.01); *H01L 2224/4809* (2013.01); *H01L 2224/48227* (2013.01); *H01L 2224/48465* (2013.01); *H01L 2224/49175* (2013.01)

(58) Field of Classification Search
CPC ... H01L 2224/48011; H01L 2224/4805; H01L 2224/48091; H01L 2224/48095; H01L 2224/48105; H01L 2224/49175; H01L 2224/49177; H01L 2224/49179; H01L 2224/4807; H01L 2224/4809; H01L 2224/48227; B41J 2002/14491; B41J 2/23; B41J 2/25; B41J 2/255; B41J 2/26; B41J 2/14072; B41J 2/1623
See application file for complete search history.

(56) References Cited

U.S. PATENT DOCUMENTS

| | | | | |
|---|---|---|---|---|
| 2010/0065963 A1* | 3/2010 | Eldridge | ............... | B23K 20/004 257/734 |
| 2011/0279548 A1* | 11/2011 | Yamamoto | ........... | B41J 2/04541 347/54 |
| 2012/0133724 A1* | 5/2012 | Nishi | ....................... | B41J 2/335 347/204 |

FOREIGN PATENT DOCUMENTS

JP    2000-12596 A    1/2000

* cited by examiner

*Primary Examiner* — Geoffrey Mruk
*Assistant Examiner* — Scott A Richmond
(74) *Attorney, Agent, or Firm* — Canon U.S.A., Inc. IP Division (57) ABSTRACT

A liquid election head includes a recording element substrate, an electrical wiring substrate configured to supply an electrical signal to the recording element substrate, a plurality of wires electrically connecting a plurality of electrode terminals on the recording element substrate with a plurality of connection terminals on the electrical wiring substrate, and a sealant sealing an electrical connection portion. The plurality of wires form a wire array. At least one of the plurality of wires positioned at one end of the wire array in a wire array direction is shorter than the other wires in the wire array.

8 Claims, 6 Drawing Sheets

LIQUID EJECTION HEAD AND METHOD OF PRODUCING THE SAME

BACKGROUND OF THE INVENTION

Field of the Invention

The present invention relates to liquid ejection heads and methods of producing the same.

Description of the Related Art

Wire bonding is known as an example of a method of electrically connecting a recording element substrate with an electrical wiring substrate in a liquid ejection head. In the wire bonding, a wire formed of gold, copper, or aluminum is used to electrically connect an electrode terminal on the recording element substrate with a connection terminal on the electrical wiring, substrate.

In the liquid ejection head, the recording element substrate and the electrical wiring substrate may shrink due to changes in their temperatures caused by heat generated while in use or a change in usage environment. The heat shrinkage changes the distance between the recording element substrate and the electrical wiring substrate, applying a stress to the wire connecting the recording element substrate with the electrical wiring substrate. In particular, when the distance between the recording element substrate and the electrical wiring substrate increases, the stress is applied to the wire in a fracture direction (longitudinal direction). This may result in a fracture of the wire.

To solve the problem, Japanese Patent Laid-Open No. 2000-12596 discloses a technique of reducing the fracture of the wire. In the technique, a bonding wire has a large slack portion so as to absorb the stress applied to the wire in the longitudinal direction.

Application of the technique disclosed in Japanese Patent Laid-Open No. 2000-12596 to liquid ejection heads is effective with respect to the stress applied to the wire in the longitudinal direction as described above, but not effective with respect to an external force (load) applied to the wire in a lateral direction. Specifically, if a plurality of wires (wire array) connecting the recording element substrate with the electrical wiring substrate each have a large slack portion, the wires are readily buckled laterally by the load applied in the lateral direction. Thus, the wires adjacent to each other may come in contact with each other, causing a short circuit. Such a problem is particularly caused when a dispenser applies a high-viscosity liquid sealant from an external side of the wire array in a wire array direction in a step of sealing an electrical connection portion, which includes the plurality of wires, between the recording element substrate and the electrical wiring substrate with a sealant. The application of the high-viscosity sealant needs a high pressure. Thus, the sealant ejected through a front end of a dispenser needle squirts from the needle when the pressure is released, resulting in application of a lateral load to the wire located at the end of the wire array.

The present invention provides a reliable liquid ejection head in which bonding wires adjacent to each other are unlikely to be brought into contact with each other by a lateral load applied to the bonding wire, and a method of producing the same.

SUMMARY OF THE INVENTION

A liquid ejection head according to the present invention includes:

a recording element substrate configured to elect a liquid;

an electrical wiring substrate configured to supply an electrical signal for ejecting the liquid to the recording element substrate;

a plurality of wires electrically connecting a plurality of electrode terminals on the recording element substrate with a plurality of connection terminals on the electrical wiring substrate, the plurality of wires form a wire array; and a sealant sealing an electrical connection portion including the plurality of electrode terminals, the plurality of connection terminals, and the plurality of wires, wherein at least one of the plurality of wires at one end of the wire array in a wire array direction is shorter than the other wires.

Further features of the present invention will become apparent from the following description of exemplary embodiments with reference to the attached drawings.

DESCRIPTION OF THE EMBODIMENTS

In the above-described liquid ejection head and the method of producing the liquid ejection head, the wire at the end of the wire array is smaller in length or larger in diameter than the other wires. This configuration reduces a lateral displacement of the wire. Thus, when a lateral load is applied from an external side of the wire array to the wire at the end of the wire array, the wire is unlikely to be buckled laterally, and to the wire does not come in contact with the adjacent wire and does not cause a short circuit. In addition, the wire at the end of the wire array functions as a block against a lateral load applied from the external side of the wire array. Thus, the lateral load is less likely to be transferred to the other wires, reducing the lateral buckling of the other wires.

The present invention provides a reliable liquid ejection head in which bonding wires adjacent to each other are unlikely to be brought into contact with each other by a lateral load applied to the bonding wire.

Hereinafter, embodiments of the present invention are described with reference to the drawings.

First Embodiment

Figure 1:
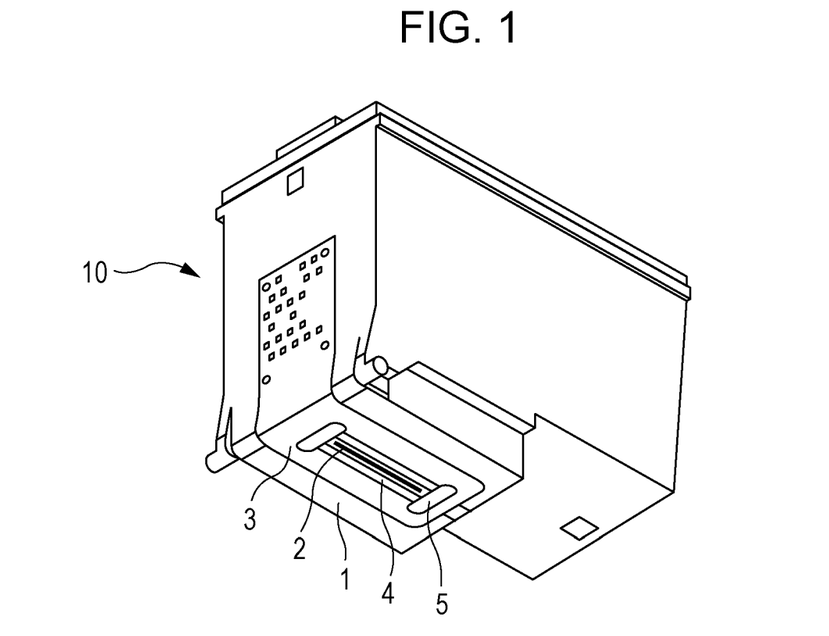
FIG. 1 is a perspective view of a liquid ejection head according to a first embodiment of the present invention.

FIG. 1 is a perspective view of a liquid ejection head according to a first embodiment of the invention.

As illustrated in FIG. 1, a liquid ejection head 10 includes a support member 1, a recording element substrate 2, an electrical wiring substrate 3, a first sealant 4, and a second sealant 5. The recording element substrate 2 and the electrical wiring substrate 3 are connected to the support member 1 such that the recording element substrate 2 is positioned in an opening (not illustrated in FIG. 1) in the electrical wiring substrate 3. The first sealant 4 seals a gap between the recording element substrate 2 and the electrical wiring substrate The second sealant 5 seals an electrical connection portion between the recording element substrate 2 and the electrical wiring substrate 3.

Figure 2:
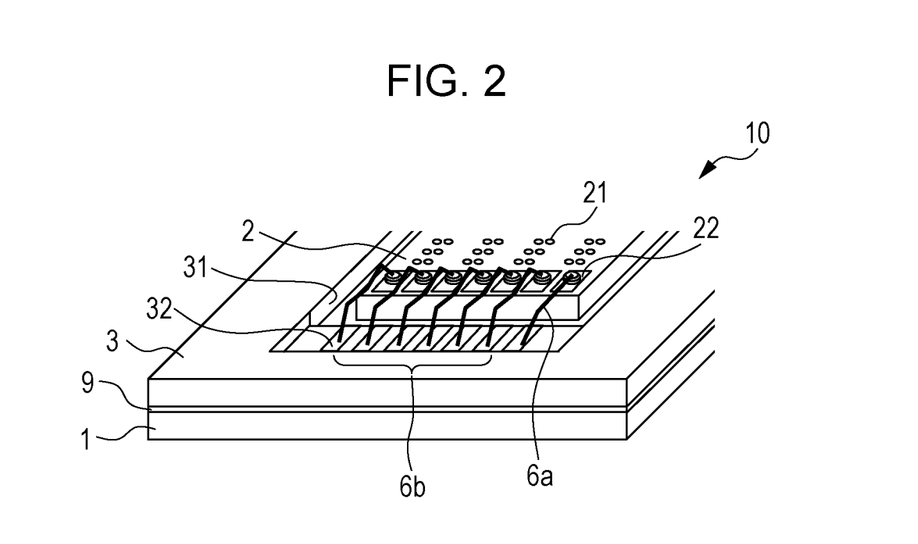
FIG. 2 is a perspective view of the main components of the liquid ejection head according to the first embodiment.
Figure 3A:
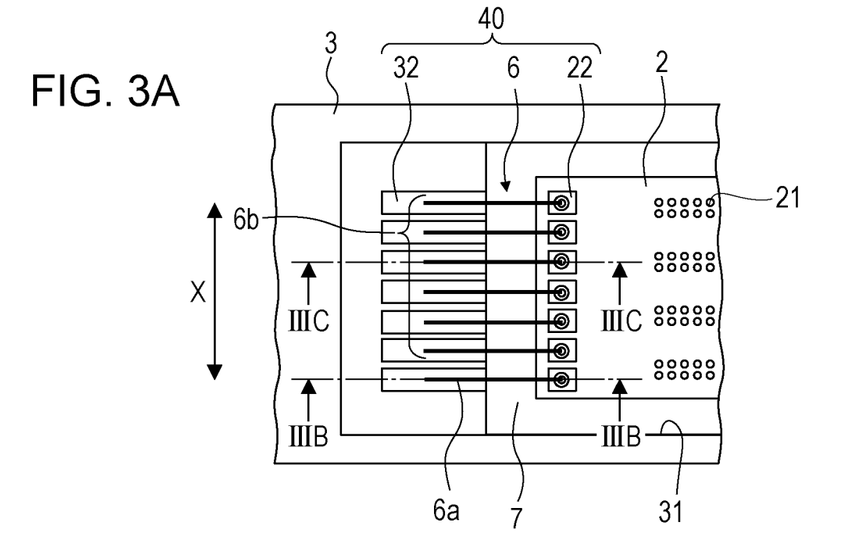
FIGS. 3A to 3C are a plan view and cross-sectional views of the main components of the liquid ejection head according to the first embodiment.
Figure 3B:
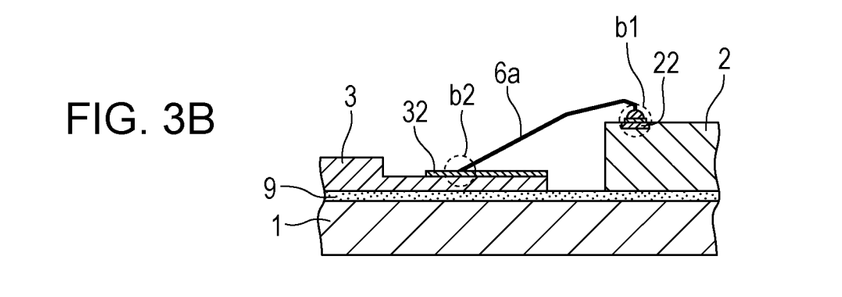
Figure 3C:
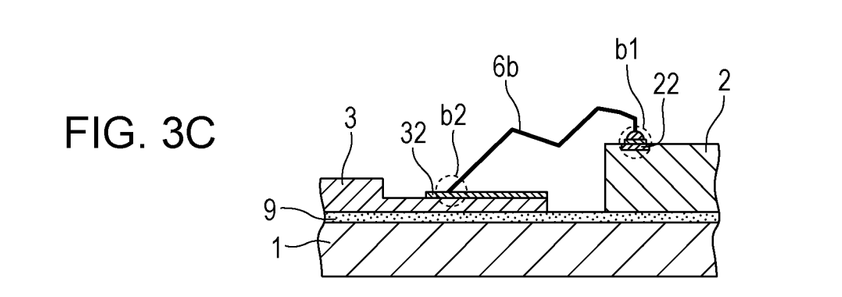

FIG. 2 is a perspective view illustrating the main components of the liquid election head according to the first embodiment. FIG. 3A is a plan view illustrating the main components of the liquid ejection head according to the first embodiment. FIG. 3B is a cross-sectional view taken along line IIIB-IIIB in FIG. 3A. FIG. 3C is a cross-sectional view taken along line MC-MC in FIG. 3A. In FIG. 2 and FIGS. 3A to 3C, the first and second sealants are not shown for ease of illustration.

The recording element substrate 2 and the electrical wiring substrate 3 are connected to the support member 1 with an adhesive 9. The recording element substrate 2 includes a plurality of ejection openings 21 through which a liquid such as an ink is ejected, a plurality of energy generating elements (not illustrated) configured to generate energy for ejecting the liquid, and a plurality of pad electrode terminals 22 configured to supply electricity to the energy generating elements. The electrode terminals 22 are located at each end in a longitudinal direction of the recording element substrate 2 and are arranged in a direction perpendicular to the longitudinal direction. The electrical wiring substrate 3 includes an opening 31 that receives the recording element substrate 2 and a plurality of lead-like connection terminals 32 configured to supply electrical signals for ejecting the liquid to the electrode terminals 22 of the recording element substrate 2. The connection terminals 32 are located at a periphery of the opening 31 so as to face the electrode terminals 22 of the recording element substrate 2 and are arranged in an array direction of the electrode terminals 22.

The electrode terminals 22 and the connection terminals 32 are electrically connected to each other by wire bonding using gold wires. In other words, the liquid ejection head 10 includes a plurality of wires 6a and 6b connecting the electrode terminals 22 with the connection terminals 32. The wires 6a and 6b make up a wire array 6 extending in an array direction of the electrode terminals 22 and the connection terminals 32. The wire 6a and 6b include a first wire 6a located at one end of the wire array 6 in an array direction X and a plurality of second wires 6b, which are the rest of the wires. As illustrated in FIG. 3B, the first wire 6a is shorter than the other wires. This configuration reduces the lateral displacement of the first wire 6a even when a lateral load is applied to the first wire 6a during the application of the sealant, which is described later. As illustrated in FIG. 3C, the second wires 6b are longer than the first wire 6a. This configuration reduces the stress applied to the second wires 6b in the longitudinal direction even when the stress is applied to the second wires 6b due to heat shrinkage of the recording element substrate 2 or the electrical wiring substrate 3. The length of the first wire 6a is 1.80 mm, for example. The length of the second wire 6b is 1.90 to 1.95 mm, for example.

The electrode terminals 22 may be located at each end in a transverse direction of the recording element substrate 2, which is perpendicular to the longitudinal direction, and may be arranged in a direction perpendicular to the transverse direction. Examples of the wire bonding include ball bonding and wedge bonding. In this embodiment, the ball bonding is employed. Examples of a material of the wires 6a and 6b include copper and aluminum, in addition to metal. The material may be selected depending on a kind of the wire bonding. The diameter of the wires 6a and 6b is 25 µm, for example.

Figure 4A:
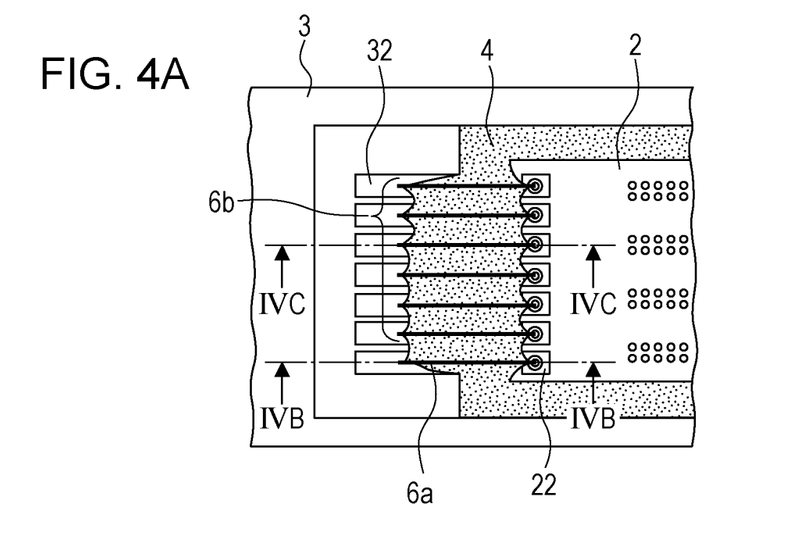
FIGS. 4A to 4C are a plan view and cross-sectional views of the main components of the liquid ejection head after a first application step.
Figure 4B:
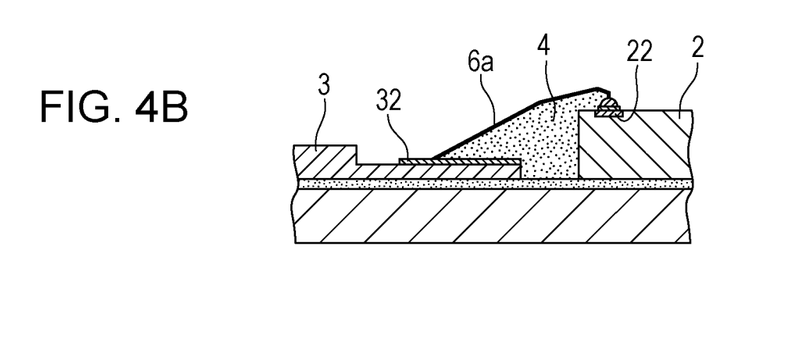
Figure 5:
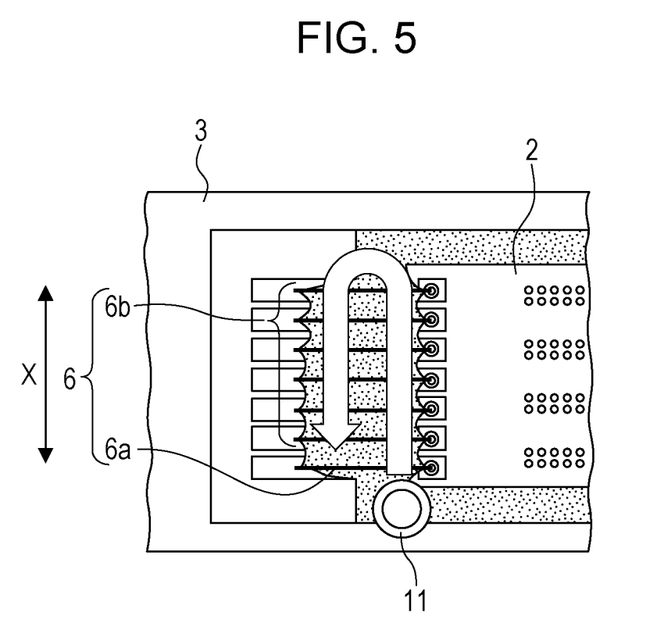
FIG. 5 is a plan view of the main components of the liquid ejection head after a second application step.
Figure 6A:
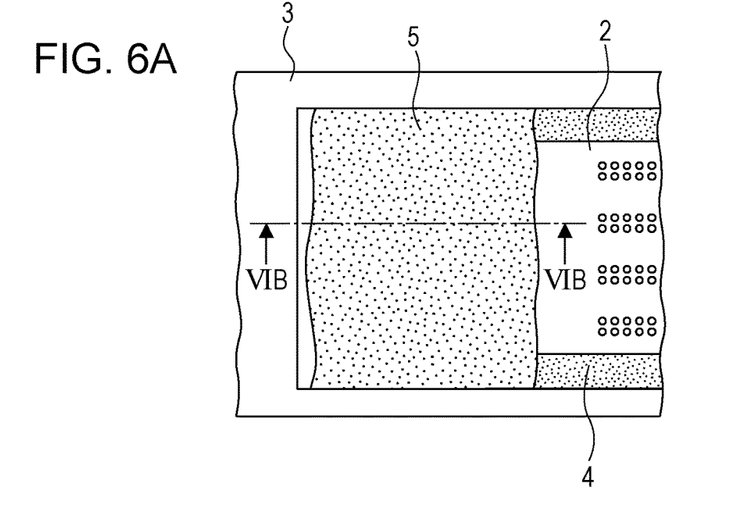
FIGS. 6A and 6B are a plan view and a cross-sectional view of the main components of the liquid ejection head after the second application step.
Figure 6B:
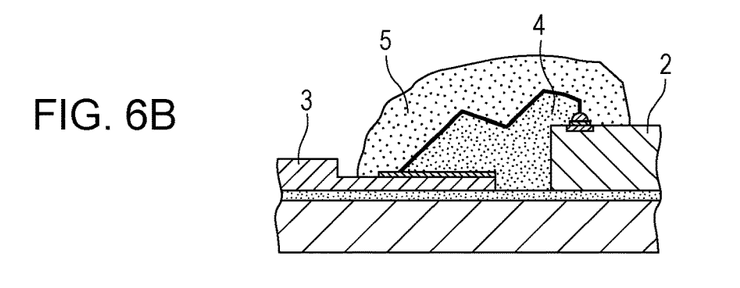

Then, a method of producing the liquid ejection head according to the first embodiment is described. Here, a first application step of applying a first sealant and a second application step of applying a second sealant are particularly described. FIG. 4A is a plan view of the main components of the liquid ejection head after the first application step. FIG. 4B is a cross-sectional view taken along IVB-IVB line in FIG. 4A. FIG. 45 is a cross-sectional view taken along IVC-IVC in FIG. 4A. FIG. 5 is a plan view of the main components of the liquid ejection head in the second application step. FIG. 6A is a plan view of the main components of the liquid ejection head after the second application step. FIG. 6B is a cross-sectional view taken along VIB-VIB in FIG. 6A.

Figure 4C:
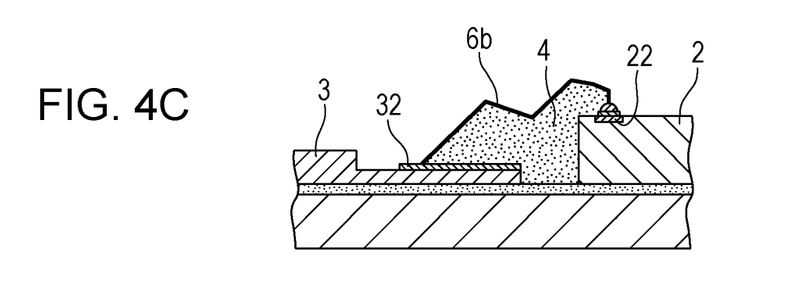

In the first application step illustrated in FIGS. 4A to 4C, the first sealant 4 formed of a thermosetting epoxy resin having low viscosity (viscosity of 10 Pa·s, for example) is applied to a gap 7 (see FIG. 3A) between the recording element substrate 2 and the opening 31 of the electrical wiring substrate 3 by using a dispenser (not illustrated). Since the first sealant 4 has low viscosity, as illustrated in FIGS. 4B and 4C, the first sealant 4 enters spaces between the wires 6a and 6b and the electrode terminals 22 and spaces between the wires 6a and 6b and the connection terminals 32 due to the meniscus force. As a result, the space below the wires 6a and 6b are filled with the first sealant 4, which is an insulating material, without any gap.

The first sealant 4 may be formed of any liquid type curable resin having low viscosity with high electrical insulating properties. Examples of a material of the first sealant 4 include an acrylic resin, epoxy acrylate resin, imide resin, and amide resin, in addition to the epoxy resin.

In the second application step illustrated in FIG. 5 and FIGS. 6A and 6B, the second sealant 5 is applied to the electrical connection portion 40 (see FIG. 3A), which includes the electrode terminals 22, the connection terminals 32, and the wires 6a and 6b, by using a dispenser. Specifically, the second sealant 5 is applied while a dispenser needle 11 is reciprocated one time in the array direction X of the wire array 6 from an external side of the first wire 6a. The dispenser needle 11 has an inner diameter of 1 mm, for example. The dispenser has a discharge pressure of 0.3 MPa, for example. As illustrated in FIGS. 6A and 6B, the second sealant 5, which is an insulating material, covers the electrical connection portion 40 between the recording element substrate 2 and the electrical wiring substrate 3.

The second sealant 5 is desired to protect the electrical connection portion 40 between the recording element substrate 2 and the electrical wiring substrate 3 from an external force and to reduce corrosion of the electrical connection portion 40 caused by contact with the liquid. Thus, the second sealant 5 can be formed of a curable resin with high insulation properties as the first sealant 4. In addition, the second sealant 5 can be formed of a liquid type curable resin having high viscosity such that the second sealant 5 maintains its shape until cured in a subsequent curing step and keeps covering the electrical connection portion 40 between the recording element substrate 2 and the electrical wiring substrate 3. The second sealant 5 may be formed of a thermosetting epoxy resin having a viscosity of 200 Pa·s, for example.

Then, the first sealant 4 and the second sealant 5 are cured by heating at 100° C. for three hours. Then, an absorber for retaining a liquid is disposed in the liquid ejection head 10 and is filled with a liquid. As a result, the liquid election head 10 illustrated in FIG. 1 is obtained. The sealants may be cured by any method other than the heat curing by heating. The sealants may be cured by using a mixture of two kinds of liquid (curing with a mixture of curing agents), or by UV curing with ultraviolet irradiation, for example.

Hereinafter, advantages of the first wire in the liquid ejection head according to the first embodiment are described.

In the second application step (see FIG. 5), the pressure of the pressurized second sealant 5 is instantly released when the second sealant 5 is ejected through the front end of the dispenser needle 11. Thus, the second sealant 5 squirts from the dispenser needle 11 and comes in contact with the first wire 6a. A lateral load is applied to the first wire 6a when the second sealant 5 having high viscosity comes in contact with the first wire 6a. However, since the first wire 6a is short, a displacement of the first wire 6a is small even when the first wire 6a is displaced laterally by the load applied by the second sealant 5. In other words, the first wire 6a is unlikely to be buckled laterally by the lateral load, and thus the first wire 6a does not come in contact with the adjacent second wire 6b and does not cause a short circuit.

To reduce the lateral buckling of the wire, the discharge pressure of the dispenser may be lowered, for example, such that the force of the sealant squirting from the dispenser needle is weakened. This reduces the load to be applied to the wire. However, a decrease in the discharge pressure applied to the sealant may result in a decrease in a discharge speed of the sealant. This requires more time for the application step, leading to deterioration in the productivity. In the present embodiment, the first wire 6a is configured so as not to be buckled laterally, and the application (ejection) of the second sealant 5 having high viscosity starts from the side of the first wire 6a. Thus, the discharge speed does not decrease. In this embodiment, for prevention of the short circuit, the application step does not require a longer time and the productivity is not deteriorated.

In addition, since the lateral displacement of the first wire 6a is small, the first wire 6a functions as a block that weakens the force of the second sealant 5 ejected from the dispenser needle 11. Thus, the first wire Ga reduces that the lateral load applied by the second sealant 5 is transferred to the second wire 6b. This reduces the lateral buckling of the second wire 6b.

As above, the first embodiment describes an example in which only one wire at the end of the wire array 6 in the array direction X is the first wire 6a having a shorter length. However, the present invention is not limited thereto. A plurality of wires, not only one wire, at the end of the wire array 6 in the array direction X may have a shorter length, for example. Depending on the method of applying the second sealant 5, a wire on each end, not only one end, of the wire array 6 in the array direction X may have a shorter length. A plurality of wires at each end of the wire array 6 in the array direction X may have a shorter length.

In addition, since the first wire 6a is short, a large stress is readily applied to the first wire 6a in the longitudinal direction (fracture direction) when the recording element substrate 2 or the electrical wiring substrate 3 is subjected to heat shrinkage. If a fracture of the first wire 6a is a concern, terminals connected to the first wire 6a may be dummy terminals, which do not contribute to the electrical connection between the recording element substrate 2 and the electrical wiring substrate 3. In other words, the first wire 6a may be a dummy wire connecting dummy terminals to each other. With this configuration, the reliability of the liquid ejection head 10 is not deteriorated even when the first wire 6a is fractured due to the heat shrinkage of the recording element substrate 2 or the electrical wiring substrate 3 after the application step of the sealant.

The method of reducing the lateral displacement of the first wire 6a to reduce the lateral buckling is not limited to the above-described method in which the length of the first wire 6a is made shorter than the other wires, and other methods may be employed. The degree of slack of the first wire 6a may be made smaller than the other wires to reduce the possibility that the first wire 6a will be buckled laterally. The degree of slack of the wire is defined by a ratio of the length of the wire to a linear distance between a bonding point b1 and a bonding point b2. The bonding point b1 is a bonding point (connection point) on the electrode terminal 22, and the bonding point b2 is a bonding point (connection point) on the connection terminal (see FIG. 3A and FIG. 3B). The degree of slack of the first wire 6a is 1.08, for example, in which the length of the first wire 6a is 1.95 ram, and the linear distance between the bonding point b1 and the bonding point b2 is 1.80 mm. The degree of slack of the second wire 6b is 1.15 to 1.20, for example, in which the linear distance between the bonding point b1 and the bonding point b2 is 1.70 to 1.90 mm.

In this modification, as in the case in which the length of the wire is made shorter, the degree of slack of the wire at each end of the wire array 6, not only the wire at one end of the wire array 6, may be made smaller. A plurality of wires at each end of the wire array 6 may be made to have a smaller degree of slack. In addition, the wire or the wires each having the smaller degree of slack may be a dummy wire or dummy wires.

Alternatively, the lateral buckling of the first wire 6a may be reduced by increasing a diameter of the first wire 6a, compared with the other wires, to increase the strength of the first wire 6a. With this configuration, the first wire 6a is unlikely to be buckled laterally when a lateral load is applied to the first wire 6a, and thus the first wire 6a does not come in contact with the second wire 6b. The diameter of the first wire 6a is 50 μm, for example, and the diameter of the second wire 6b is 25 μm, for example. The first and second wires 6a and 6b in this case each have a length of 1,900 to 1,950 μm, for example, and the degree of slack of 1.15 to 1.20, for example.

In this modification, the wire at each end of the wire array 6, not only the wire at one end of the wire array 6, may have a larger diameter. A plurality of wires at each end of the wire array 6 each may have a larger diameter. The degree of slack of the wire or wires each having a larger diameter may be decreased to further reduce the lateral buckling of the wire or wires.

Second Embodiment

Figure 7:
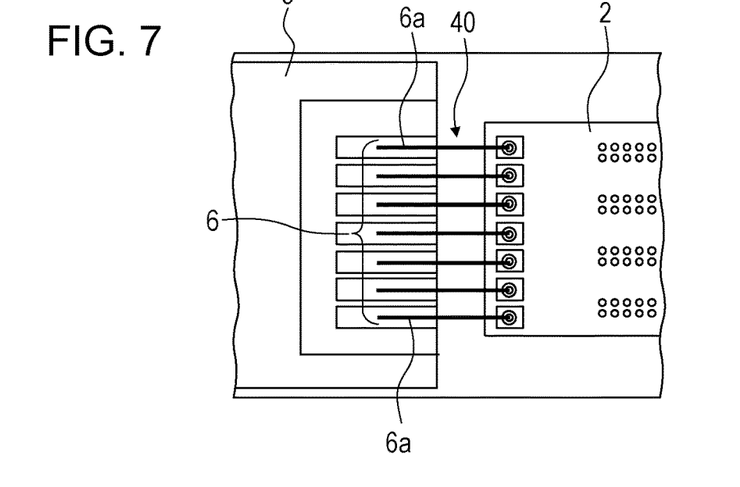
FIG. 7 is a plan view of the main components of the liquid ejection head according to a second embodiment of the invention.

FIG. 7 is a plan view of the main components of a liquid election head according to a second embodiment of the present invention.

This embodiment differs from the first embodiment in that the electrical wiring substrate 3 does not include the opening, and the gap to be filled with the first sealant is not formed around the recording element substrate 2. Thus, in this embodiment, the first wire 6a is provided at each end of the wire array 6, not only at one end of the wire array 6, and a step of applying another sealant is added before the first and second application steps. Hereinafter, a preliminary application step added in this embodiment and the first and second application steps after the preliminary application step are described. FIG. 8A to 8D are plan views of the main components of the liquid ejection head in each application step.

Figure 8A:
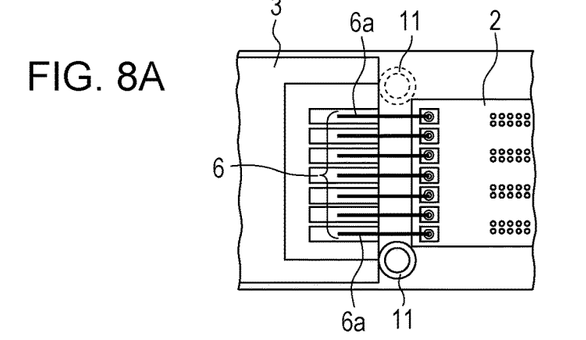
FIGS. 8A to 8D are plan views of the main components of the liquid election head in application steps.
Figure 8B:
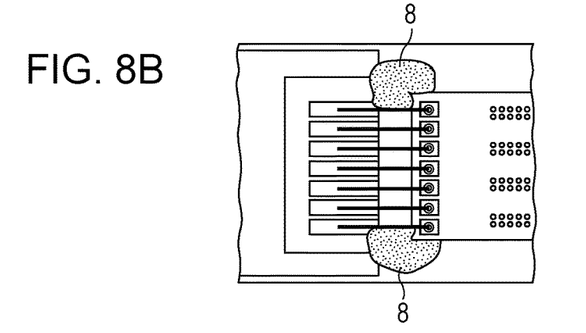

In the preliminary application step illustrated in FIGS. 8A and 8B, a preliminary sealant 8 is applied dropwise to external sides of the first wires 6a located at ends of the wire array 6 so as to be positioned between the recording element substrate 2 and the electrical wiring substrate 3. The preliminary sealant 8 can be formed of a curable resin with high insulation properties and can have high viscosity such that the preliminary sealant 8 keeps its shape until cured in a subsequent curing step, in the same way as the second sealant. The preliminary sealant 8 may be formed of a thermosetting epoxy resin having viscosity of 200 Pa·s, for example. The preliminary sealant 8 having high viscosity squirts from the dispenser needle 11 when ejected through the front end of the dispenser needle 11, in the same way as the second sealant, and thus the preliminary sealant 8 comes in contact with the first wires 6a at the ends of the wire array 6 and applies a lateral load to each of the first wires 6a. However, since the first wires 6a are short, the first wires 6a are unlikely to be buckled laterally by the lateral load and do not come in contact with the second wires 6b. Thus, a short circuit does not occur.

Figure 8C:
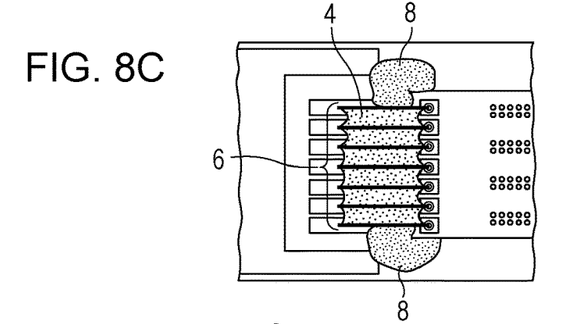
Figure 8D:
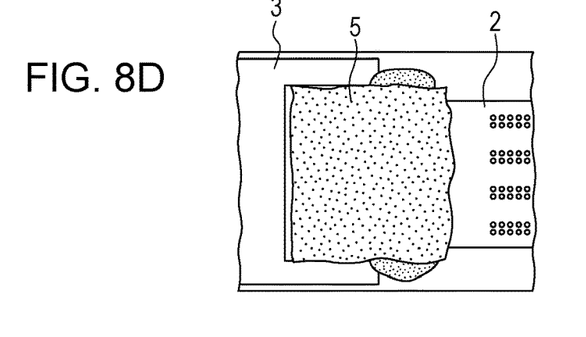

Then, as in the first embodiment, in the first application step illustrated in FIG. 8C, the first sealant 4 formed of a liquid type curable resin having low viscosity is applied so as to fill the space below the wire array 6 without any gap. At this time, the first sealant 4 is blocked by the preliminary sealant 4 and does not leak from the space. Then, as in the first embodiment, in the second application step illustrated in FIG. 80), the second sealant 5 formed of a liquid type curable resin having high viscosity is applied to cover the electrical connection portion 40 (see FIG. 7) between the recording element substrate 2 and the electrical wiring substrate 3.

In the second embodiment, a plurality of wires at each end of the wire array 6, not only one wire at each end of the wire array 6, may be the first wires 6a. In addition, the first wires 6a each may have a smaller degree of slack or may have a larger diameter. The first wires 6a each having a larger diameter may also have a smaller degree of slack.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-145602, filed Jul. 23, 2015, which is hereby incorporated by reference herein in its entirety.

What is claimed is:

1. A liquid ejection head comprising:
   a recording element substrate configured to eject a liquid;
   an electrical wiring substrate configured to supply an electrical signal for ejecting the liquid to the recording element substrate;
   a plurality of wires electrically connecting a plurality of electrode terminals on the recording element substrate with a plurality of connection terminals on the electrical wiring substrate, the plurality of wires form a wire array; and
   a sealant sealing an electrical connection portion including the plurality of electrode terminals, the plurality of connection terminals, and the plurality of wires, wherein
   the plurality of wires includes a first wire at one outermost end of the wire array in a wire array direction, a third wire at another outermost end of the wire array in the wire array direction, and a plurality of second wires adjacent to each other between the first wire and the third wire, and the first wire is shorter than each of the plurality of second wires and the third wire.

2. The liquid ejection head according to claim 1, wherein a ratio of a length of the first wire to a linear distance between a connection point to one of the plurality of electrode terminals and a connection point to one of the plurality of connection terminals is smaller than that of each of the plurality of second wires.

3. The liquid ejection head according to claim 1, wherein the first wire does not contribute to the supply of the electrical signal to the recording element substrate.

4. The liquid ejection head according to claim 1, wherein the sealant is disposed in an area including an external side of the wire array in the wire array direction.

5. The liquid ejection head according to claim 1, wherein the plurality of second wires adjacent to each other are disposed in a center portion of the wire array in the wire array direction.

6. The liquid ejection head according to claim 1,
   wherein a plurality of connection portions to each of which a different one of the plurality of electrode terminals and a different one of the plurality of wires are connected is linearly disposed along the wire array direction, and
   wherein a plurality of connection portions to each of which a different one of the plurality of connection terminals and a different one of the plurality of wires are connected is linearly disposed along the wire array direction.

7. A method of producing the liquid ejection head according to claim 1, the method comprising:
   sealing the electrical connection portion, wherein
   the sealing includes applying a liquid type curable resin in the wire array direction so as to cover the electrical connection portion, a start point of the application being located on an external side of the wire array adjacent to the at least one wire in the wire array direction.

8. The method of producing the liquid ejection head according to claim 7, wherein the sealing the electrical connection portion includes applying a droplet of the liquid type curable resin onto the external side of the wire array adjacent to the at least one wire in the wire array direction and then applying the liquid type curable resin in the wire array direction from the start point where the droplet of the liquid type curable resin is located so as to cover the electrical connection portion.

* * * * *